United States Patent
Hwang

(10) Patent No.: US 8,089,106 B2
(45) Date of Patent: Jan. 3, 2012

(54) IMAGE SENSOR AND METHOD FOR MANUFACTURING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 272 days.

(21) Appl. No.: 12/344,541

(22) Filed: Dec. 28, 2008

(65) Prior Publication Data

US 2009/0166793 A1 Jul. 2, 2009

(30) Foreign Application Priority Data

Dec. 28, 2007 (KR) .......................... 10-2007-0139743
Jun. 30, 2008 (KR) .......................... 10-2008-0062692

(51) Int. Cl.
*H01L 27/148* (2006.01)
(52) U.S. Cl. ................ 257/233; 257/292; 257/E31.054; 438/98
(58) Field of Classification Search .................. 257/233, 257/292
See application file for complete search history.

(56) References Cited

U.S. PATENT DOCUMENTS

| | | | |
|---|---|---|---|
| 6,841,411 B1* | 1/2005 | Varghese | 438/94 |
| 7,009,227 B2* | 3/2006 | Patrick et al. | 257/233 |
| 7,115,855 B2* | 10/2006 | Hong | 250/214.1 |
| 7,838,955 B2* | 11/2010 | Shim | 257/440 |
| 2004/0041930 A1* | 3/2004 | Chao et al. | 348/294 |
| 2004/0238911 A1* | 12/2004 | Roy | 257/444 |
| 2005/0035381 A1* | 2/2005 | Holm et al. | 257/290 |
| 2007/0285545 A1* | 12/2007 | Hsieh | 348/294 |
| 2009/0065826 A1* | 3/2009 | Hwang | 257/292 |
| 2009/0065887 A1* | 3/2009 | Hwang | 257/461 |
| 2010/0079638 A1* | 4/2010 | Hwang | 348/294 |

FOREIGN PATENT DOCUMENTS

| | | |
|---|---|---|
| KR | 10-2005-0117674 | 12/2005 |
| KR | 10-2005-0074445 | 2/2007 |

* cited by examiner

*Primary Examiner* — Benjamin Sandvik
(74) *Attorney, Agent, or Firm* — Sherr & Vaughn, PLLC

(57) ABSTRACT

Embodiments relate to an image sensor. According to embodiments, an image sensor may include a metal interconnection, readout circuitry, a first substrate, an image sensing device, and a second conduction type interfacial layer. The metal interconnection and the readout circuitry may be formed on and/or over the first substrate. The image sensing device may include a first conduction type conduction layer and a second conduction type conduction layer and may be electrically connected to the metal interconnection. The second conduction type interfacial layer may be formed in a pixel interface of the image sensing device.

17 Claims, 6 Drawing Sheets

IMAGE SENSOR AND METHOD FOR MANUFACTURING THE SAME

Figure 1:
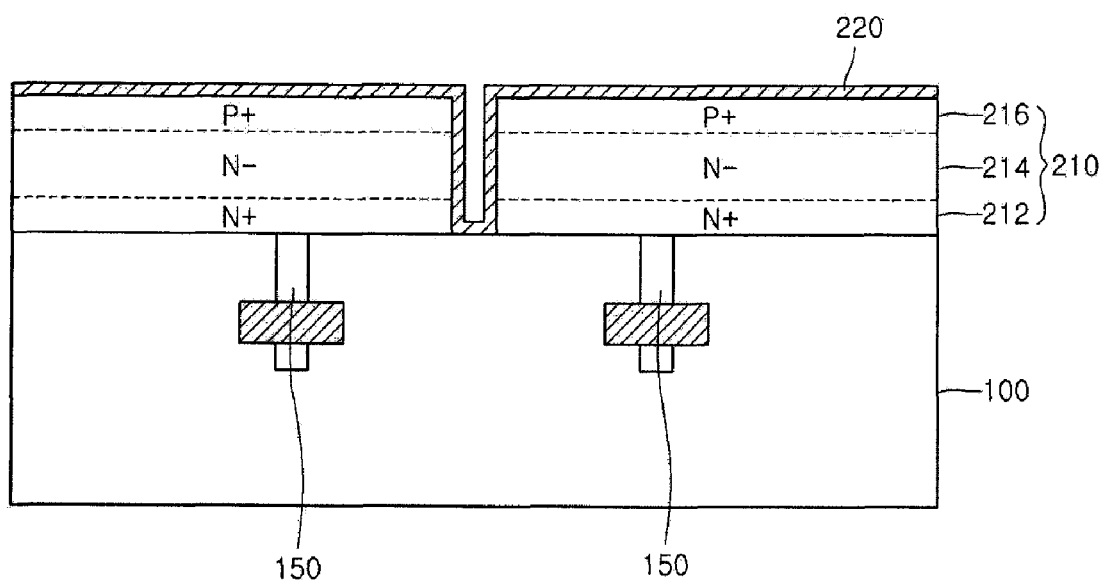

The present application claims priority under 35 U.S.C. 119 to Korean Patent Application No. 10-2007-0139743 (filed on Dec. 28, 2007) and Korean Patent Application No. 10-2008-0062692 (filed Jun. 30, 2008), which are hereby incorporated by reference in their entireties.

BACKGROUND

An image sensor may be a semiconductor device that may convert an optical image into an electrical signal. An image sensor may be classified into categories, such as a charge coupled device (CCD) image sensor and a complementary metal oxide silicon (CMOS) image sensor (CIS).

During a fabrication process of an image sensor, a photodiode may be formed in a substrate using ion implantation. A size of a photodiode may be reduced to increase a number of pixels without increasing a chip size. This may reduce an area of a light receiving portion. Image quality may thereby be reduced.

Since a stack height may not reduce as much as a reduction in an area of a light receiving portion, a number of photons incident to a light receiving portion may also be reduced due to diffraction of light called Airy disk.

To address this limitation, a photodiode may be formed using amorphous silicon (Si). In addition, readout circuitry may be formed in a silicon (Si) substrate using a method such as wafer-to-wafer bonding, and a photodiode may be formed on and/or over readout circuitry (referred to as a three-dimensional (3D) image sensor). A photodiode may be connected with readout circuitry through a metal interconnection.

According to the related art, it may be difficult to electrically connect a photodiode to readout circuitry. That is, a metal interconnection may be formed on and/or over readout circuitry and wafer-to-wafer bonding may be performed such that a metal interconnection may contact the photodiode. Hence, a contact between a metal interconnection may be difficult, and an ohmic contact between a metal interconnection and a photodiode may be difficult.

After wafer-to-wafer bonding may be performed, an etching process may be performed and may separate a photodiode for each unit pixel. An interface of a photodiode may be damaged and a dangling bond and the like may occur. This may act as a dark current source.

Since both a source and a drain at both sides of a transfer transistor may be heavily doped with N-type impurities, a charge sharing phenomenon may occur. When a charge sharing phenomenon occurs, a sensitivity of an output image may be reduced and an image error may be generated. In addition, because a photo charge may not readily move between a photodiode and readout circuitry, a dark current may be generated and/or saturation and sensitivity may be reduced.

SUMMARY

Embodiments relate to an image sensor and a manufacturing method thereof that may remove damage such as a dangling bond in an interface of a photodiode, while increasing a fill factor. Embodiments relate to an image sensor and a manufacturing method thereof that may prevent an occurrence of charge sharing while increasing a fill factor.

Embodiments relate to an image sensor and a manufacturing method thereof that may minimize a dark current source and may prevent reduction in saturation and sensitivity by providing a relatively swift movement path for a photo charge between a photodiode and a readout circuitry.

According to embodiments, an image sensor may include at least one of the following. A metal interconnection and a readout circuitry on and/or over a first substrate. An image sensing device including a first conduction type conduction layer and a second conduction type conduction layer and electrically connected to the metal interconnection. A second conduction type interfacial layer formed in a pixel interface of the image sensing device.

According to embodiments, a method for manufacturing an image sensor may include at least one of the following. Forming a metal interconnection and a readout circuitry on and/or over a first substrate. Forming an image sensing device including a first conduction type conduction layer and a second conduction type conduction layer. Electrically connecting the metal interconnection to the image sensing device. Forming a second conduction type interfacial layer in a pixel interface of the image sensing device.

DRAWINGS

Example FIGS. 1 through 10 illustrate an image sensor and a method for manufacturing an image sensor, according to embodiments.

DESCRIPTION

An image sensor and a method for manufacturing an image sensor in accordance with embodiments will be described in detail with reference to the accompanying drawings.

Example FIG. 1 is a sectional view of an image sensor, according to embodiments. Referring to example FIG. 1, an image sensor may include metal interconnection 150 and readout circuitry 120 over first substrate 100. According to embodiments, an image sensor may include image sensing device 210, which may include first conduction type conduction layer 214 and second conduction type conduction layer 216, and may be electrically connected to metal interconnection 150. According to embodiments, second conduction type interfacial layer 220 may be formed in a pixel interface of image sensing device 210.

According to embodiments, image sensing device 210 may be a photodiode, a photogate or any combination thereof. According to embodiments, a photodiode may be formed in a crystalline semiconductor layer. According to embodiments, a photodiode may not be limited thereto and may be formed in an amorphous semiconductor layer.

Figure 2A:
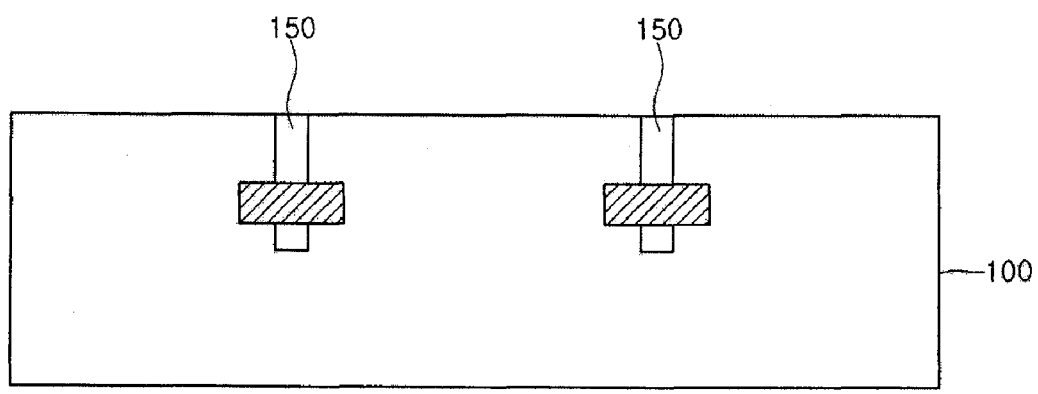

A method for manufacturing an image sensor according to embodiments will be described with reference to example FIGS. 2 through 9. Example FIG. 2A is a schematic view of first substrate 100 including metal interconnection 150 and readout circuitry 120, according to embodiments. Example FIG. 2B is a view of first substrate 100, according to embodiments.

Figure 2B:
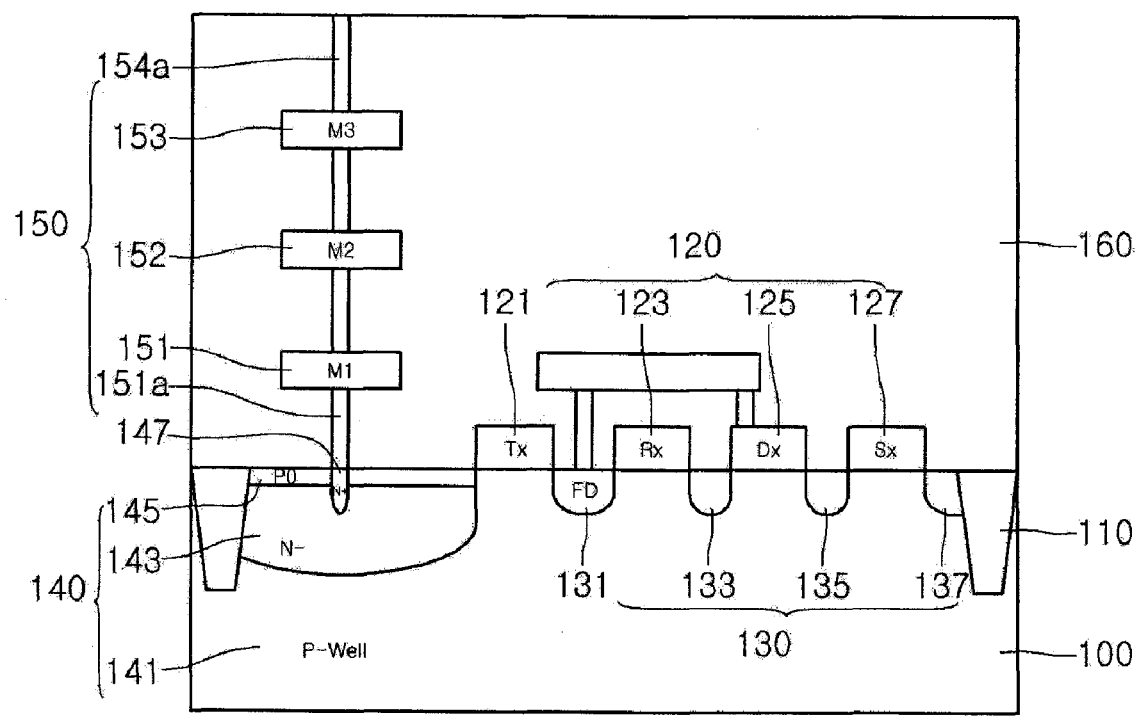

Referring to example FIG. 2B, first substrate 100 may be prepared. Metal interconnection 150 and readout circuitry 120 may be formed on and/or over first substrate 100. According to embodiments, first substrate 100 may be a second conduction type substrate. According to embodiments, first substrate 100 may be any conduction type substrate.

According to embodiments, device isolation layer 110 may be formed in second conduction type first substrate 100 and may define an active region. Readout circuitry 120 may include at least one transistor formed in the active region. According to embodiments, readout circuitry 120 may include transfer transistor (Tx) 121, reset transistor (Rx) 123, drive transistor (Dx) 125 and select transistor (Sx) 127. According to embodiments, floating diffusion region (FD) 131 of ion implantation regions 130 may be formed, and may include source/drain regions 133, 135, and 137 of respective transistors.

According to embodiments, forming readout circuitry 120 on and/or over first substrate 100 may include forming electrical junction region 140 in first substrate 100 and forming first conduction type connection region 147 in an upper region of electrical junction region 120. According to embodiments, first conduction type connection region 147 may be electrically connected to metal interconnection 150.

According to embodiments, electrical junction region 140 may be a PN junction. According to embodiments, electrical junction region 140 may be any type junction. According to embodiments, electrical junction region 140 may include first conduction type ion implantation layer 143 formed on and/or over either second conduction type well 141 or a second conduction type epitaxial layer. Electrical junction region 140 may include second conduction type ion implantation layer 145 formed on and/or over first conduction type ion implantation layer 143. According to embodiments, PN junction 140 may be a P0 (145)/N− (143)/P− (141) junction.

According to embodiments, there may be a potential difference between a source and drain on both sides of transfer transistor (Tx) 121. According to embodiments, a photo charge may thus be fully dumped. According to embodiments, a photo charge generated from a photodiode may be fully dumped to floating diffusion region (FD) 131 and a sensitivity of an output image may be maximized.

Electrical junction region 140 may be formed in first substrate 100, and proximally located to readout circuitry 120. Electrical junction region 140 may permit generation of a potential difference between a source and a drain on both sides of transfer transistor (Tx) 121. This may allow a photo charge to be fully dumped.

A dumping structure of a photo charge according to embodiments will be described. Unlike a node of floating diffusion region (FD) 131, which may be an N+ junction, P/N/P junction 140, which may be electrical junction region 140 and to which an applied voltage may not be fully transferred, may be pinched-off at a predetermined voltage. This voltage may be called a pinning voltage, and may depend on doping concentrations of P0 region 145 and N− region 143.

According to embodiments, an electron generated from photodiode 210 may move to PNP junction 140, and may be transferred to a node of floating diffusion region (FD) 131. It may then be converted into a voltage if transfer transistor (Tx) 121 is turned on.

According to embodiments, since a maximum voltage value of P0/N−/P− junction 140 may become a pinning voltage, and a maximum voltage value of a node of floating diffusion region (FD) 131 may become threshold voltage Vth of Vdd-Rx 123, an electron generated from photodiode 210 in an upper portion of a chip may be fully dumped to a node of floating diffusion region (FD) 131. This may be done without charge sharing due to a potential difference between both sides of transfer transistor (Tx) 131.

According to embodiments, a P0/N−/P−well junction, not an N+/P−well junction, may be formed in a silicon substrate such as first substrate 100. According to embodiments, this may allow a +voltage to be applied to N− 143 of a P0/N−/P−well junction and a ground voltage to be applied to P0 145 and P−well 141 during a 4-Tr active pixel sensor (APS) reset operation. According to embodiments, a pinch-off may be generated to a P0/N−/P−well double junction at a predetermined voltage or more. This may be similar to a bipolar junction transistor (BJT) structure. This may be called a pinning voltage. According to embodiments, a potential difference may be generated between a source and a drain at both sides of transfer transistor (Tx) 121. This may prevent a charge sharing phenomenon during an on/off operations of transfer transistor (Tx) 121.

According to embodiments, unlike a case where a photodiode may be simply connected to an N+ junction, limitations such as saturation reduction and sensitivity reduction may be avoided.

According to embodiments, first conduction type connection region 147 may be formed between photodiode 210 and readout circuitry 120. This may provide a relatively swift movement path of a photo charge. According to embodiments, a dark current source may be minimized, and saturation reduction and sensitivity reduction may be minimized or prevented.

According to embodiments, first conduction type connection region 147, which may be for ohmic contact, for example, N+ region 147, may be formed on and/or over a surface of P0/N−/P− junction 140. N+ region 147 may be formed and may extend through P0 region 145 and may contact N− region 143.

According to embodiments, to prevent first conduction type connection region 147 from becoming a leakage source, a width of first conduction type connection region 147 may be minimized. According to embodiments, a plug implant may be performed after first metal contact 151a is etched. According to embodiments, other processes may be performed. According to embodiments, an ion implantation pattern may be formed. First conduction type connection region 147 may be formed using the ion implantation pattern as an ion implantation mask.

According to embodiments, by locally and heavily doping only a contact forming portion with N−type impurities, ohmic contact formation may be facilitated while minimizing a dark signal. By heavily doping an entire transfer transistor source, a dark signal may be increased by an Si surface dangling bond.

According to embodiments, interlayer dielectric 160 may be formed on and/or over first substrate 100. Metal interconnection 150 may then be formed and may extend through interlayer dielectric 160 and may be electrically connected to first conduction type connection region 147. According to embodiments, metal interconnection 150 may include first metal contact 151a, first metal 151, second metal 152, third metal 153, and fourth metal contact 154a. According to embodiments, other structures could be used.

Figure 3:
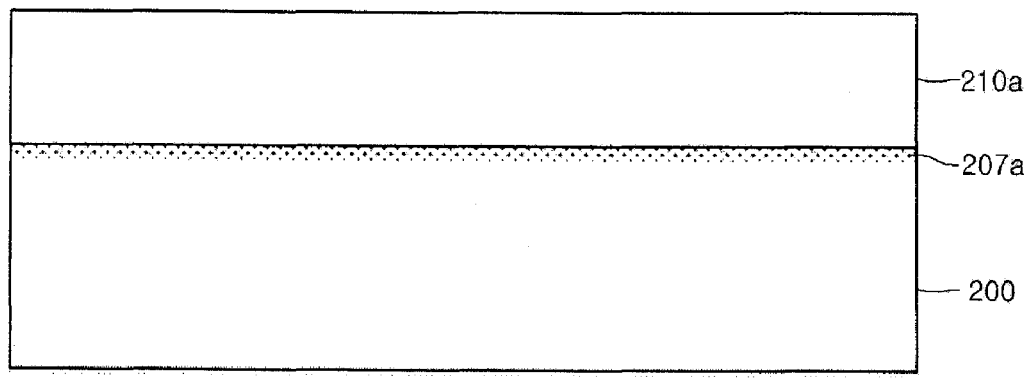

Referring to FIG. 3, crystalline semiconductor layer 210a may be formed on and/or over second substrate 200. According to embodiments, photodiode 210 may be formed in crystalline semiconductor layer 210a. According to embodiments, an image sensing device may implement a 3-dimensional (3D) image sensor, which may be located on and/or over readout circuitry 120. This may raise a fill factor. According to embodiments, an image sensor may be formed inside a crystalline semiconductor layer, which may prevent defects inside an image sensing device.

According to embodiments, crystalline semiconductor layer 210a may be formed on and/or over second substrate 200 using epitaxial growth. According to embodiments, hydrogen ions may be implanted between second substrate 200 and crystalline semiconductor layer 210a. This may form hydrogen ion implantation layer 207a interposed between second substrate 200 and crystalline semiconductor layer 210a. According to embodiments, implantation of hydrogen ions may be performed after an ion implantation for forming photodiode 210.

Figure 4:
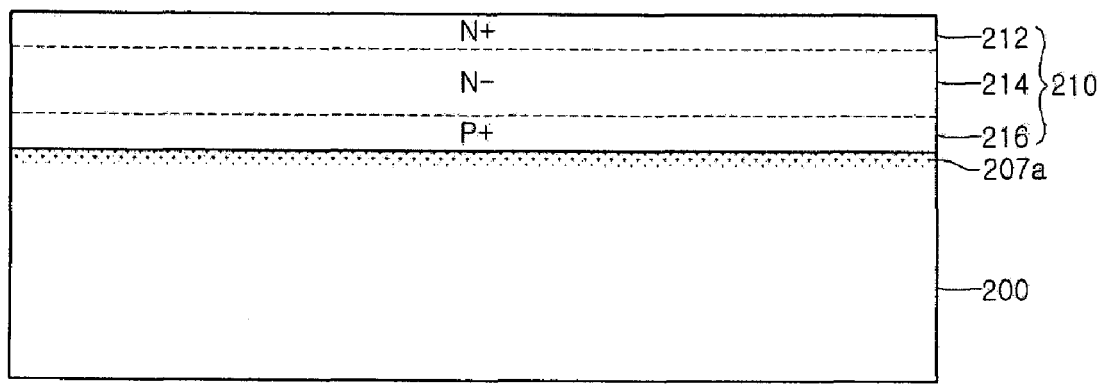

Referring to example FIG. 4, photodiode 210 may be formed in crystalline semiconductor layer 210a using ion implantation. According to embodiments, second conduction type conduction layer 216 may be formed in a lower portion of crystalline semiconductor layer 210a and may be formed on and/or over hydrogen ion implantation layer 207a and may be in contact with hydrogen ion implantation layer 207a. High concentration P-type conduction layer 216 may be formed in a lower portion of crystalline semiconductor layer 210a, for example by performing a first blanket-ion implantation on and/or over an entire surface of second substrate 200 without a mask.

According to embodiments, first conduction type conduction layer 214 may be formed on and/or over second conduction type conduction layer 216, for example by performing a second blanket-ion implantation on and/or over an entire surface of second substrate 200 without a mask. According to embodiments, high concentration first conduction type conduction layer 212 may be formed on and/or over first conduction type conduction layer 214, for example by performing a third blanket-ion implantation on and/or over an entire surface of second substrate 200 without a mask. According to embodiments, first conduction type conduction layer 214 may contribute to ohmic contact.

Figure 5:
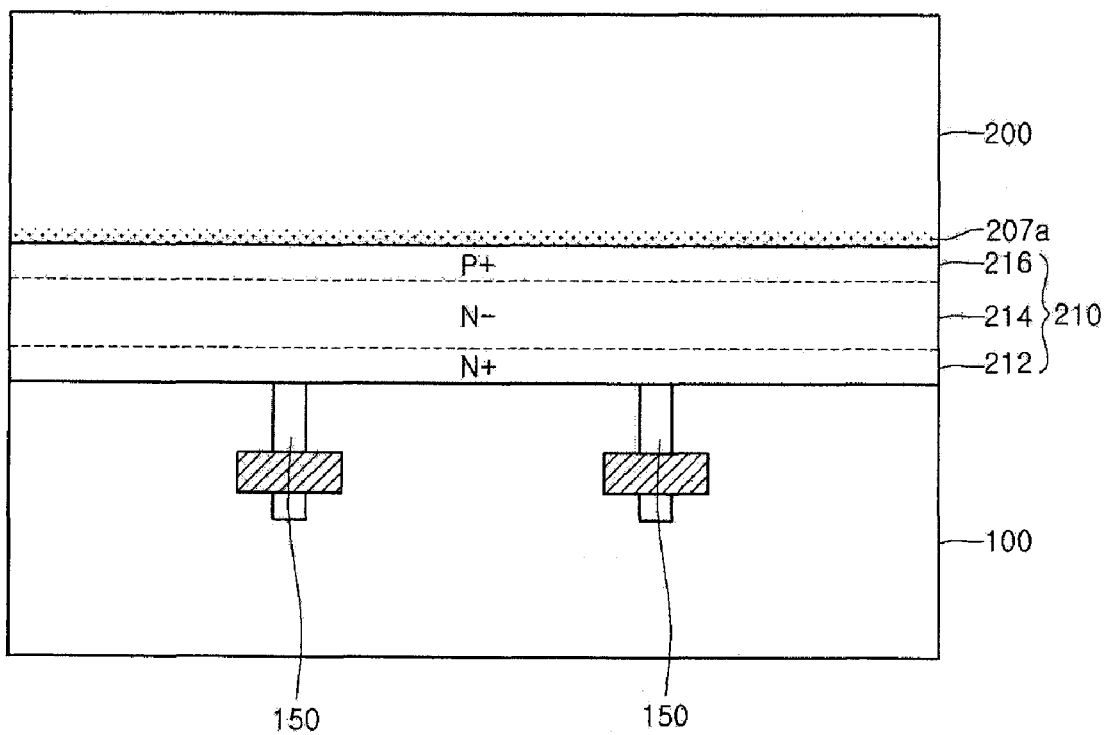

Referring example FIG. 5, first substrate 100 and second substrate 200 may be bonded. According to embodiments, photodiode 210 may contact metal interconnection 150. According to embodiments, first substrate 100 and second substrate 200 may be bonded to each other by increasing a surface energy of a surface that may be bonded through activation by plasma. According to embodiments, bonding may be performed with a dielectric or a metal layer disposed on and/or over a bonding interface. This may maximize a bonding force.

Figure 6:
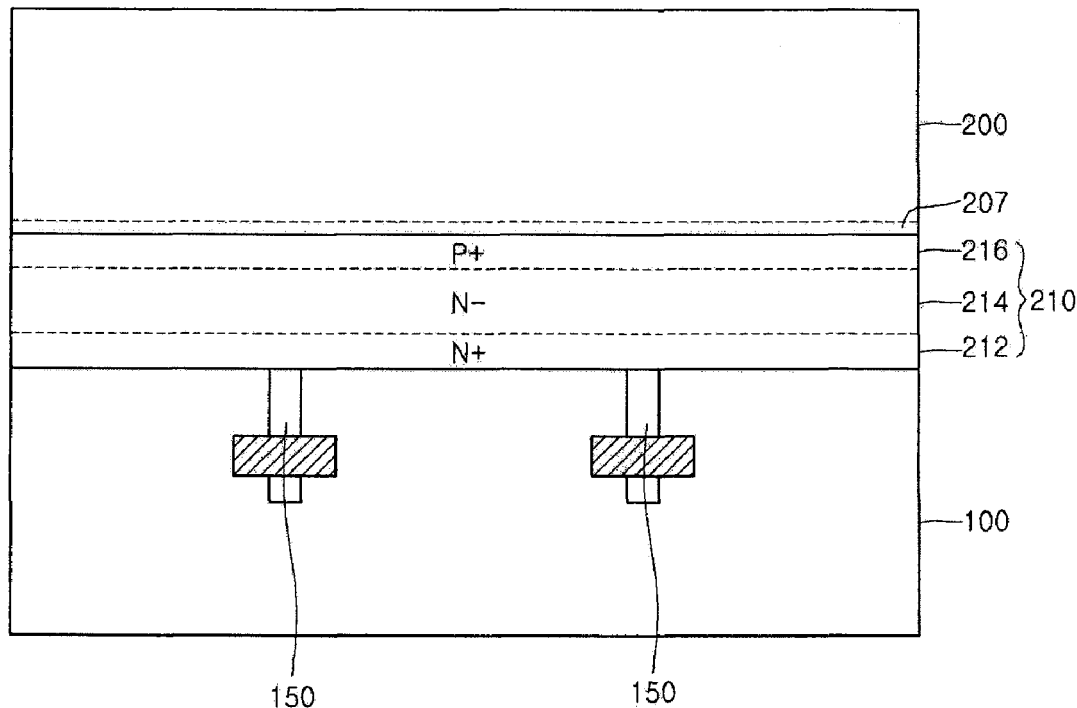

Referring to example FIG. 6, hydrogen ion implantation layer 207a may be changed into a hydrogen gas layer by performing heat treatment to second substrate 200.

Figure 7:
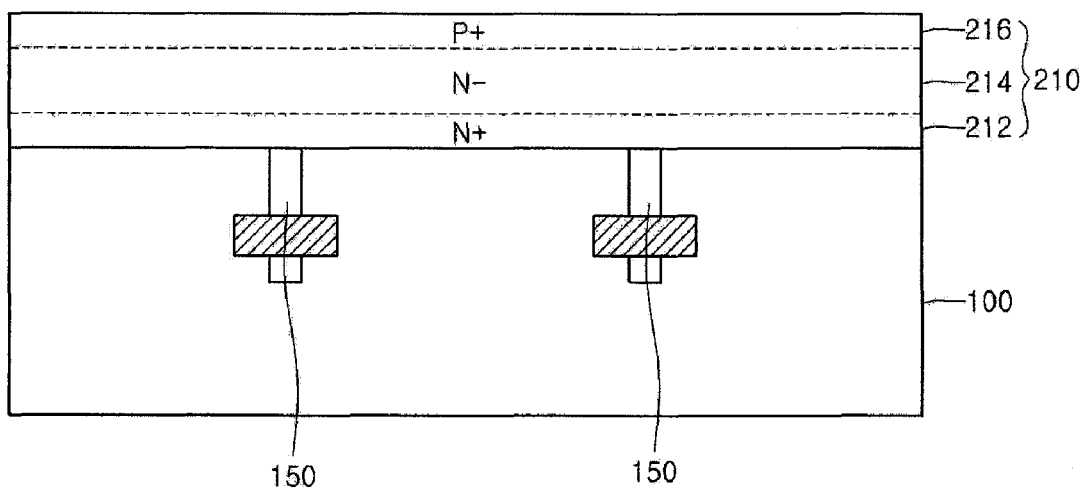

Referring to example FIG. 7, according to embodiments, a portion of second substrate 200 may then be removed. According to embodiments, photodiode 210 may remain under a hydrogen gas layer. According to embodiments, photodiode 210 may thus be exposed. According to embodiments, second substrate 200 may be removed, for example using a cutting apparatus, such as a blade.

Figure 8:
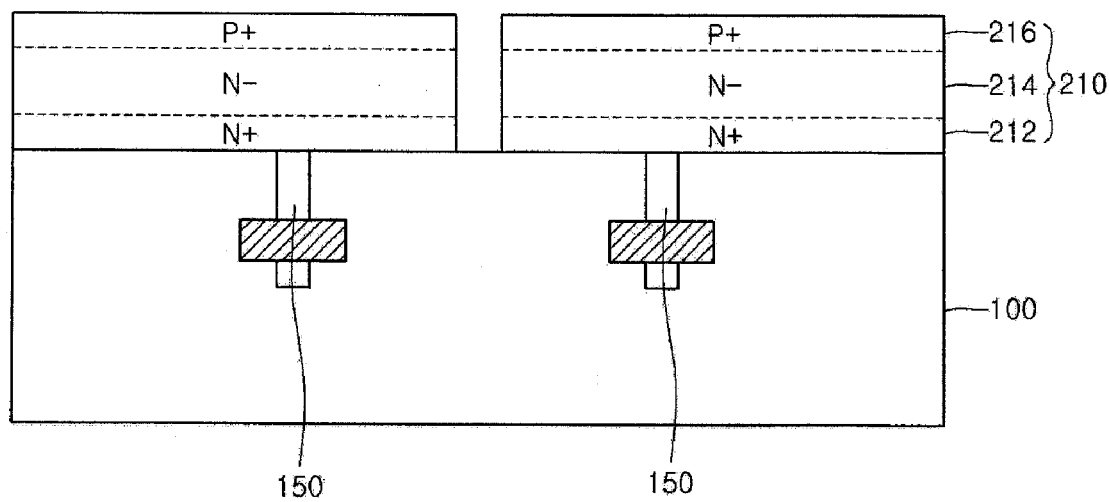

Referring to example FIG. 8, an etching process may be performed and may separate a photodiode for each unit pixel.

Figure 9:
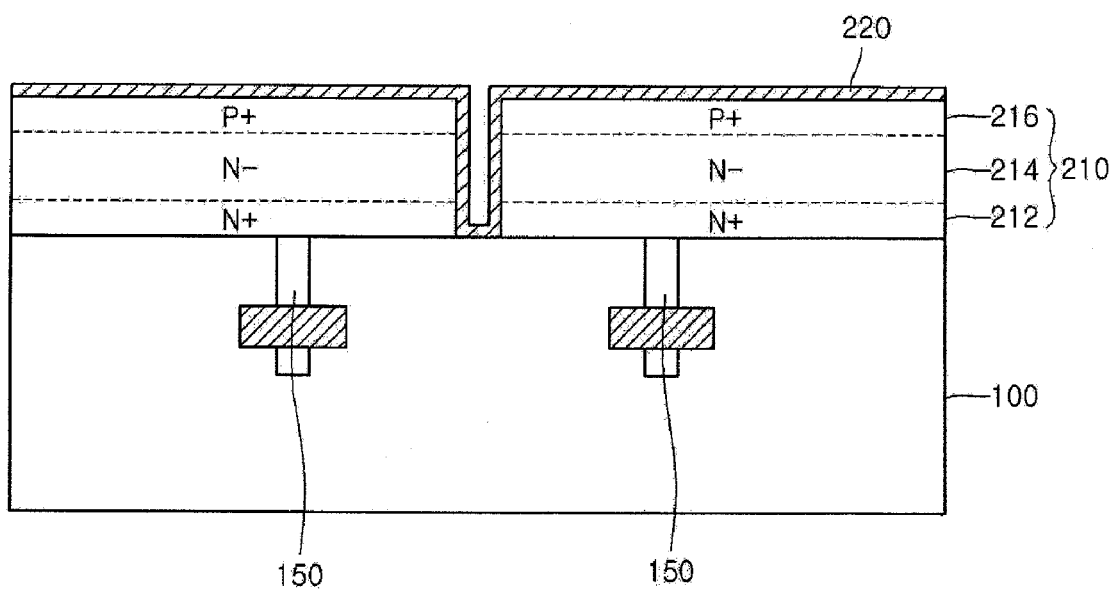

Referring to example FIG. 9, second conduction type interfacial layer 220 may be formed on and/or over an interpixel interface. According to embodiments, second conduction type interfacial layer 220 may be a P-type interfacial layer. According to embodiments, second conduction type interfacial layer 220 may be any type interfacial layer. According to embodiments, second conduction type interfacial layer 220 may be an interfacial layer doped with an element of Group III. According to embodiments, second conduction type interfacial layer 220 may be a BSG interfacial layer. According to embodiments, second conduction type BSG interfacial layer 220 may be formed in a thickness range of approximately 500-5000 Å. According to embodiments, other processes may be used.

According to embodiments, second conduction type interfacial layer 220 may be formed on and/or over a side surface and an upper surface of photodiode 210, as illustrated in example FIG. 9. Alternatively, second conduction type interfacial layer 220 may be formed on and/or over a side surface of photodiode 210.

According to embodiments, an image sensor may implement a vertical type photodiode and may have a P-type interfacial layer coupled to a dangling bond in an interface of a vertical type photodiode. Accordingly, damage may be removed and a dark current may be minimized.

According to embodiments, a BSG layer, which may be a boron-containing silicate glass, may be formed on and/or over photodiode 210 after an etching process to separate a photodiode for each unit pixel may be performed. Accordingly, a dangling bond generated in a silicon interface that may be damaged due to an etching of photodiode 210 may be diffused into a boron atom (P+ impurity). This may convert a silicon interface into a P+ state, which may remove damage and minimize a dark current.

According to embodiments, processes may be performed to form an upper electrode and a color filter.

Figure 10:
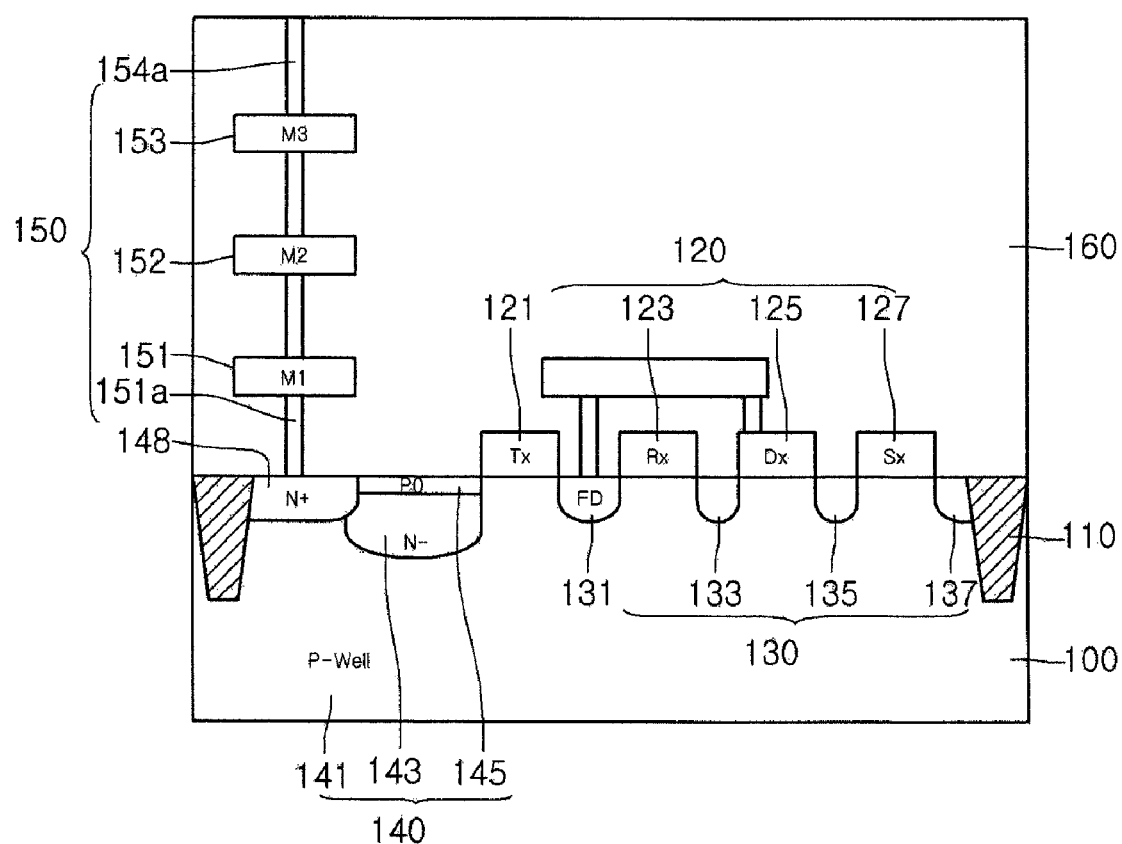

Example FIG. 10 is a sectional view of an image sensor, according to embodiments. Referring to example FIG. 10, an image sensor may include metal interconnection 150 and readout circuitry 120 over first substrate 100. According to embodiments, an image sensor may include image sensing device 210, which may include first conduction type conduction layer 214 and second conduction type conduction layer 216, and may be electrically connected to metal interconnection 150. According to embodiments, second conduction type interfacial layer 220 may be formed in a pixel interface of image sensing device 210. According to embodiments, image sensing device 210 may not be limited to a photodiode. According to embodiments, image sensing device 210 may be a photodiode, a photogate, or any combination thereof. According to embodiments, an image sensor may include electrical junction region 140, which may be formed in first substrate 100.

According to embodiments, a device illustrated in example FIG. 10 may implement various technical characteristics of embodiments illustrated in example FIGS. 1 through 9. According to embodiments, damage in an interface of photodiode 210 may be removed and may decrease a dark current while increasing the fill factor by forming a P-type interfacial layer on and/or over an interface of photodiode 210. According to embodiments, a P-type interfacial layer may be coupled to a dangling bond.

According to embodiments, a potential difference may exist between a source and a drain in both sides of transfer transistor (Tx). According to embodiments, a photo charge may be fully dumped. According to embodiments, a charge connection region may be formed between photodiode 210 and readout circuitry 120. This may provide a relatively swift movement path of a photo charge. According to embodiments, a dark current source may be minimized, and saturation reduction and sensitivity reduction may be prevented.

Unlike embodiments illustrated in example FIGS. 1 through 9, first conduction type connection region 148 may be formed to be spaced laterally on and/or over one side of electrical junction region 140. Alternatively, according to embodiments, N+ connection region 148, which may be for ohmic contact, may be formed on and/or over P0/N-/P- junction 140. A process of forming N+ connection region 148 and M1C contact 151a may provide a leakage source. This may be because a device may operate with a reverse bias applied to P0/N-/P- junction 140. Accordingly, an electric field (EF) may be generated on and/or over an Si surface. A crystal defect that may be generated during a contact forming process inside an electric field may serve as a leakage source.

According to embodiments, if an N+ connection region 148 is formed on and/or over a surface of P0/N–/P– junction 140, an electric field may be generated due to N+/P0 junction 148/145. This electric field may also serve as a leakage source.

According to embodiments, a layout may be provided in which first contact plug 151a may be formed in an active region not doped with a P0 layer but including N+ connection region 148 and may be connected to N–junction 143.

According to embodiments, an electric field may not be generated on and/or over an Si surface. This may contribute to a reduction in a dark current of a 3D integrated CIS.

Although embodiments may be described with respect to a complementary metal oxide semiconductor (CMOS) image sensor, embodiments may not be limited to a CIS. According to embodiments, any image sensor requiring a photodiode may be used.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
   a metal interconnection and a readout circuit over a first substrate;
   an image sensing device, including a first conduction type conduction layer and a second conduction type conduction layer, electrically connected to the metal interconnection; and
   a second conduction type interfacial layer formed in a pixel interface of the image sensing device and doped with an element of Group III, the second conduction type interfacial layer directly contacting the first conduction type conduction layer and the second conduction type conduction layer of the image sensing device,
   wherein the second conduction type interfacial layer is formed over a side surface and an upper surface of the image sensing device.

2. The device of claim 1, wherein the second conduction type interfacial layer is formed over a side surface of the image sensing device.

3. The device of claim 1, wherein the readout circuit comprises an electrical junction region in the first substrate.

4. The device of claim 3, wherein the electrical junction region comprises:
   a first conduction type ion implantation region in the first substrate; and
   a second conduction type ion implantation region over the first conduction type ion implantation region.

5. The device of claim 4, comprising a first conduction type connection region electrically connected to the metal interconnection over the electrical junction region.

6. The device of claim 4, wherein the electrical junction region comprises a PNP junction.

7. The device of claim 4, comprising a first conduction type connection region spaced apart from the electrical junction region and electrically connected to the metal interconnection.

8. The device of claim 1, wherein the readout circuit comprises a transistor, and wherein a potential difference exists between a source and a drain at both sides of the transistor.

9. The device of claim 8, wherein the transistor comprises a transfer transistor, and wherein the source of the transistor has an ion implantation concentration lower than an ion implantation concentration of a floating diffusion region.

10. A method, comprising:
    forming a metal interconnection and a readout circuit over a first substrate;
    forming an image sensing device including a first conduction type conduction layer and a second conduction type conduction layer over the first substrate;
    electrically connecting the metal interconnection to the image sensing device; and
    forming a second conduction type interfacial layer doped with an element of Group III in a pixel interface of the image sensing device, the second conduction type interfacial layer directly contacting the first conduction type conduction layer and the second conduction type conduction layer of the image sensing device,
    wherein the second conduction type interfacial layer is formed over a side surface and an upper surface of the image sensing device.

11. The method of claim 10, comprising forming the second conduction type interfacial layer over a side surface of the image sensing device.

12. The method of claim 10, wherein forming the readout circuit comprises forming an electrical junction region in the first substrate.

13. The method of claim 12, wherein forming the electrical junction region comprises:
    forming a first conduction type ion implantation region in the first substrate; and
    forming a second conduction type ion implantation region over the first conduction type ion implantation region.

14. The method of claim 13, comprising forming a first conduction type connection region connected to the metal interconnection over the electrical junction region.

15. The method of claim 14, wherein the first conduction type connection region is formed after performing a contact etch of the metal interconnection.

16. The method of claim 13, comprising forming a first conduction type connection region spaced apart from the electrical junction region and electrically connected to the metal interconnection.

17. The method of claim 16, wherein the first conduction type connection region contacts a device isolation region and is connected to the electrical junction region.

* * * * *